U S006681829B2

(12) United States Patent
Baccini

(10) Patent No.: US 6,681,829 B2
(45) Date of Patent: Jan. 27, 2004

(54) AUTOMATIC SEPARATOR AND METHOD TO OBTAIN CIRCUITS FOR MICROELECTRONICS

(76) Inventor: Gisulfo Baccini, Via Duca d'Aosta, 1 - 31030 Mignagola di Carbonera (TV) (IT)

( * ) Notice: Subject to any disclaimer, the term of this patent is extended or adjusted under 35 U.S.C. 154(b) by 158 days.

(21) Appl. No.: 10/007,915

(22) Filed: Nov. 9, 2001

(65) Prior Publication Data

US 2002/0053394 A1 May 9, 2002

(30) Foreign Application Priority Data

Nov. 9, 2000 (IT) .................................... UD2000A0206

(51) Int. Cl.$^7$ .............................................. B32B 35/00
(52) U.S. Cl. ...................................... 156/584; 156/344
(58) Field of Search .............................. 156/344, 584, 156/247, 249; 271/281, 282, 283, 285

(56) References Cited

U.S. PATENT DOCUMENTS

| 5,466,330 A | | 11/1995 | Sakai et al. | |
| 5,532,724 A | * | 7/1996 | Inagaki et al. | 347/213 |
| 5,538,591 A | * | 7/1996 | Collins et al. | 156/584 |
| 5,540,809 A | * | 7/1996 | Ida et al. | 156/584 |

FOREIGN PATENT DOCUMENTS

| JP | 03 218802 A | 9/1991 |
| JP | 03 232659 A | 10/1991 |
| JP | 06 255880 A | 9/1994 |
| JP | 08 244019 A | 9/1996 |
| JP | 09 114384 A | 5/1997 |
| JP | 09 169461 A | 6/1997 |
| JP | 11 208986 A | 8/1999 |

OTHER PUBLICATIONS

W. Cole, et al. "Mechanism for Peeling Paper from Greensheets", *IBM Technical Disclosure Bulletin*, vol. 23, No. 4 (Sep. 1, 1980).

* cited by examiner

*Primary Examiner*—Mark A. Osele
(74) *Attorney, Agent, or Firm*—Akin Gump Strauss Hauer & Feld, L.L.P.

(57) ABSTRACT

Automatic separator to separate the supporting sub-layer from the print support in work elements for microelectronics and method to realize such separation. The automatic separator comprises a pick up plate provided with depression-type elements for picking up the print support. The pick up plate is movable from a first position in which each print support is stored together with the associated supporting sub-layer to a second position wherein each print support is positioned without the associated supporting sub-layer for a subsequent manufacturing phase. The pick up plate during its movement bring the supporting sub-layer in contact with stationary detachment elements which cause the separation of the supporting sub-layer from the related print support.

28 Claims, 3 Drawing Sheets

AUTOMATIC SEPARATOR AND METHOD TO OBTAIN CIRCUITS FOR MICROELECTRONICS

FIELD OF THE INVENTION

The present invention concerns an automatic separator to separate a print support from the related supporting sub-layer wherein the print support is normally constituted by a base material used to print circuits in microelectronics and to make up multi-layer circuits.

An example of this print support is typically the so called green tape, which is a Du Pont® trade mark and material. However, there are other materials in the state of the art which perform the same functions or analogous functions.

The present invention also concerns the method to obtain circuits for microelectronics on a print support.

BACKGROUND OF THE INVENTION

In the following description the term print support means any support, made of any material whatsoever, which serves to print circuits in microelectronics and to make up multi-layer circuits.

Likewise, the supporting sub-layer, which serves to hold the print support in the correct position and in the desired size, can be made for example of Mylar, P.E.T. or other material suitable for the purpose.

It should be remembered that the print support, within very narrow tolerances, has to keep its size and the reciprocal position of the holes and the printed parts until the various specialized supports have been assembled, which assembly fixes the whole thing, also in relation to the other supports.

It should also be remembered that the materials which make up the print supports, which have a thickness varying from 0.008 mm to 0.30 mm, are affected by even the smallest stress, whether it be heat or mechanical stress, so that, if they are not handled with particular care, at the moment the supporting sub-layer is detached from the print support, they modify their size.

It is therefore important to be able to perform all the necessary operations on the print support keeping the supporting sub-layer and removing it at the last moment, that is to say, a short time before the print support is assembled with other specialized print supports.

The invention is therefore applied to already cut print supports with the relative supporting sub-layer, before any operation is started thereon, in squares or rectangles or other shape of limited size, already holed and printed and ready to be assembled or positioned on the application plane.

The invention also comprises the method to perform all the operations of holing, centering, printing and handling the print support, since the latter is combined with the supporting sub-layer.

At present the supporting sub-layer is detached when the print support is still wound in a roll.

This creates subsequent problems in handling the print support cut into squares or rectangles or into other shapes of limited size, since the print support is not stable during the operations of holing, centering, printing and handling.

Document U.S. Pat. No. 5,466,330 discloses a handling apparatus for ceramic green sheets, wherein for separating the carrier films from the ceramic green sheets, which are prepared for manufacturing a ceramic multilayer circuit board, each ceramic green sheet is maintained in a rest position by a stationary attracting head. The separation is obtained by gradually removing the carrier film by means of a chuck which is movable with respect to the stationary attracting head starting from an end of the ceramic green sheet.

IBM Technical Disclosure Bulletin Vol. 23, No. 4, September 1980, W. Cole et al, discloses a mechanism for peeling paper from green sheets, wherein a vacuum transfer head picks up the top green sheet and the underlying paper sheet and transfer them to the screening station. The backing paper is then peeled off the underside of the green sheet by means of a gripping mechanism which firstly grips the lefthand edge of the paper backing sheet and then is lowered at a short distance with respect to the vacuum transfer head.

Document JP-A-03218802 discloses a film peeling device wherein a green sheet is placed on a given position on a stationary jig and vacuum sucked. One end of the film to be removed is clamped between two rollers which are moved at a constant speed with respect to the stationary jig, so that the film is peeled from the surface of the green sheet.

SUMMARY OF THE INVENTION

The invention is set forth and characterized in the main claims, while the dependent claims describe other innovative features of the invention.

According to the invention, the work elements, each constituted by a print support and the related supporting sub-layer, are normally cut in a square shape, but also in other shapes, from a roll consisting of the print support with the relative supporting sub-layer. The work elements are then worked in conventional fashion, as necessary, to obtain the desired circuits.

Therefore, the holes are made and the circuits printed on and in said work elements, since the supporting sub-layer is always solidly applied on the print support.

The work element is handled, centered, controlled and stored, always in this reciprocal condition. When the work element has to be combined with other work elements in the desired order, a short time before this combination, the supporting sub-layer is detached from the print support.

During this detachment step and until assembly, the print support is kept in a defined geometric position so as not to suffer any deformation. This geometric position is obtained by means of a plate, advantageously flat, by means of which a desired depression is exerted which holds the print support stationary and still, and does not allow it to deform.

The action of detachment, according to the invention, occurs automatically when the print support is already complete and it is ready to be assembled with other print supports so as to form the desired multi-layer circuit.

According to the invention, the detachment occurs while the print support is moving.

According to the invention, gripping means act on the edge of the supporting sub-layer inducing on said edge an action of detachment which detaches the edge of the supporting sub-layer from the print support and then, progressively, the two elements are completely separated.

According to a first embodiment, the first detachment occurs along one edge of the work element.

According to another embodiment, the first detachment occurs in correspondence with a corner of the work element.

According to a first embodiment of the invention, the gripping means are roller means made of material suitable to interact with the material which makes up the supporting sub-layer, thus creating the desired action of detachment.

According to the invention, the roller means cooperate with the plate bearing the work element, and between the two a pre-defined and pre-definable pressure is maintained, which is related to the material which makes up the roller and the material which makes up the supporting sub-layer.

Means to detach the supporting sub-layer from the roller are provided.

According to a first embodiment, the roller is idle and is made to rotate by the reciprocal movement of the roller and the plate bearing the work element.

According to another embodiment, the roller is made to rotate at a tangential speed equal to the speed of reciprocal displacement of the roller and the plate.

Means to clean the roller and/or restore the properties thereof, which allow the roller to create the desired detachment force, are provided.

According to a variant, an adhesive strip cooperates with the surface of the work element consisting of the supporting sub-layer; the adhesive strip is stuck onto the supporting sub-layer and detaches it from the print support.

Said adhesive strip is then wound in a roll with the supporting sub-layers stuck on.

It is within the spirit of the invention to provide means to detach the supporting sub-layer from the adhesive strip before the latter is re-wound; thus the adhesive strip can be re-used.

It is also within the spirit of the invention to provide a strip which is cleaned on each occasion and as necessary, and re-impregnated with adhesive material, so that it is possible to use a continuous strip.

According to another variant, a removing means cooperates with the edge or corner and achieves the detachment of the print support and the supporting sub-layer, then accompanies the supporting sub-layer until the final detachment.

BRIEF DESCRIPTION OF THE DRAWINGS

We shall now see the invention, in some of its variants, with the help of the attached diagrams, given as a non-restrictive example, wherein.

DETAILED DESCRIPTION OF A PREFERENTIAL EMBODIMENT

Figure 1:
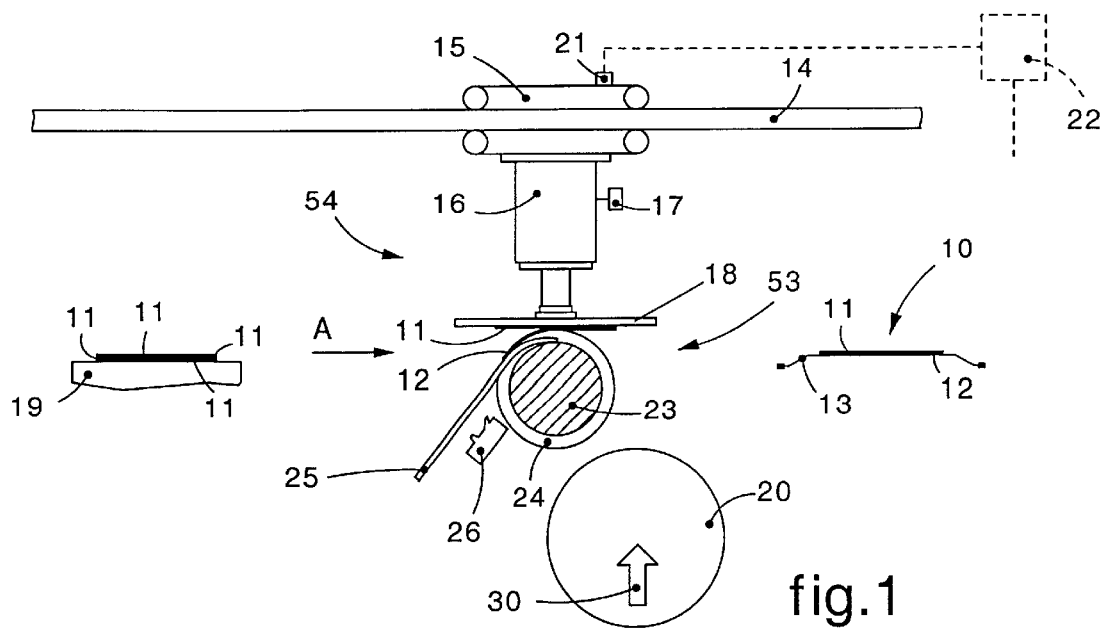
FIG. 1 shows the detachment of the supporting sub-layer, in movement, with a roller.
Figure 2:
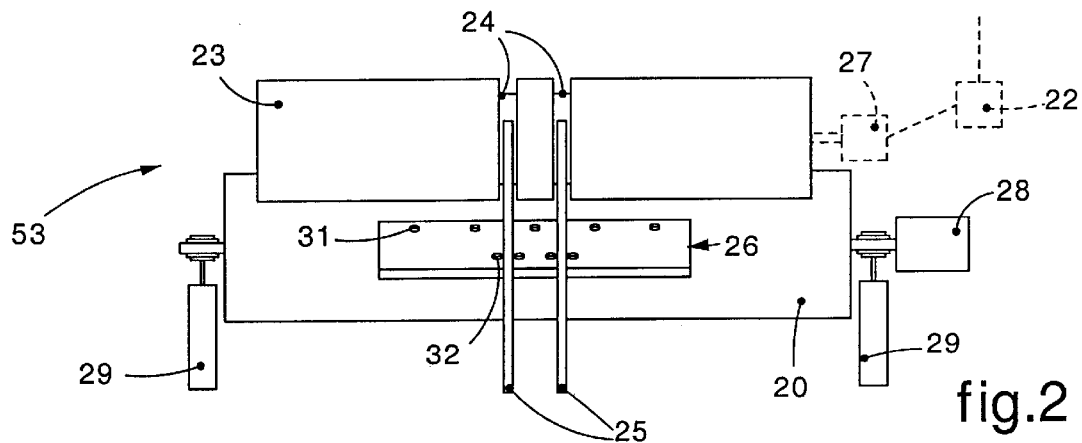
FIG. 2 shows the system of FIG. 1 with a view from A.

FIGS. 1 and 4–7 show a work element 10 consisting of a print support 11 and a related supporting sub-layer 12. The work element 10, complete with holes and printed circuits on the support 11 is positioned in a first position, here schematically represented by a store 13 or by any other means coherent with the manufacturing steps upstream.

The work element 10, when it is in the first position, is already cut from an original roll, not shown in the drawings, and subjected to all the necessary manufacturing steps of holing, printing, shaping, handling, storing and any other steps needed for the specific purpose.

The work element 10 is subjected to the whole work cycle with the print support 11 having been combined with the relative supporting sub-layer 12.

Only when a print supports 11 is to be positioned in a second position, here schematically represented by an assembly 19, for being assembled together with other print supports 11, according to a desired sequence, the relative supporting sub-layer 12 is detached from the print support 11.

According to a feature of the present invention, the detachment between the supporting sub-layer 12 and the print support 11 occurs during the movement of the print support 11 from the store 13 towards the assembly 19, by means of detachment members 53, which will be better disclosed hereinafter.

According to the invention, the work element 10 is gripped, positioned and held in the correct geometric position by a pick up and handling assembly 54, which comprises a plate 18 provided with a plurality of holes 33 through which a desired depression is applied on the print support 11.

The plate 18 is supported by vertical movement means 16, which in turn are supported and moved by a trolley 15, which moves in conventional fashion on one or more rails 14.

The vertical movement means 16 have means to detect and control the pressure 17, which serve to gauge the pressure exerted by the plate 18 on the detachment members 53; the pressure is coordinated with the characteristics of the supporting sub-layer 12 and the detachment means 23, 123, 47, 48.

The trolley 15, depending on the application, can have means to detect the speed 21 which serve to detect the speed of displacement of the trolley 15 and to control it.

Means to control the suction force (not shown in the drawings) cooperate with the plate 18.

In the example shown in FIG. 1, the detachment members 53 consist of a detachment roller 23 which has one or more detachment hollows 24 with which detachment blades 25 cooperate.

A group of detachment nozzles 26 is provided to detach the supporting sub-layer 12 from the roller 23, by means of nozzles 31, and to detach the supporting sub-layer 12 from the blades 25 by means of nozzles 32.

A cleaning and restoring roller 20 cooperates with the detachment roller 23 and is made to rotate by a motor 28; it is driven on each occasion by drive jacks 29 which take it into contact with the detachment roller 23.

The detachment roller 23 can be idle, or it can be kept in rotation by a controlled speed motor 27 which causes the tangential speed of the roller 23 to be equal to the linear speed of the plate 18.

If there is a motor 27, it is subject, through the processing and control means 22, to the speed detection means 21.

Figure 3:
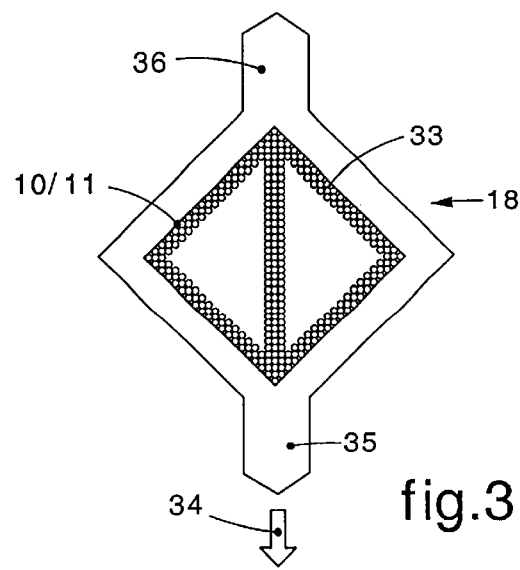
FIG. 3 is a view from below of the plate for gripping and positioning the work element, when the detachment roller is idle.

In the case shown in FIG. 3, the detachment roller 23 is idle and the plate 18 has an advancing head 35 and a tail 36 used to maintain motion.

In the case shown in FIG. 1 and FIG. 3, the supporting sub-layer 12 is detached by operating on a corner; this may entail that the work element 10 has to be rotated through 45° once it has been removed from the store 13.

The plate 18 advances in the direction of advance 34 and enters into contact with the idle detachment roller 23 through the advancing head 35, then takes the detachment roller 23 to the correct tangential speed before it enters into contact with the work element 10.

When the detachment roller 23 enters into contact with the corner of the supporting sub-layer 12 thanks to the pressure and reciprocal friction, it detaches it from the print support 11 and takes it with it.

The supporting sub-layer 12 slides on the detachment blades 25 and is held detached from the roller 23 and the blades 25 by the air blown by the nozzles 31 and 32 respectively.

Figure 4:
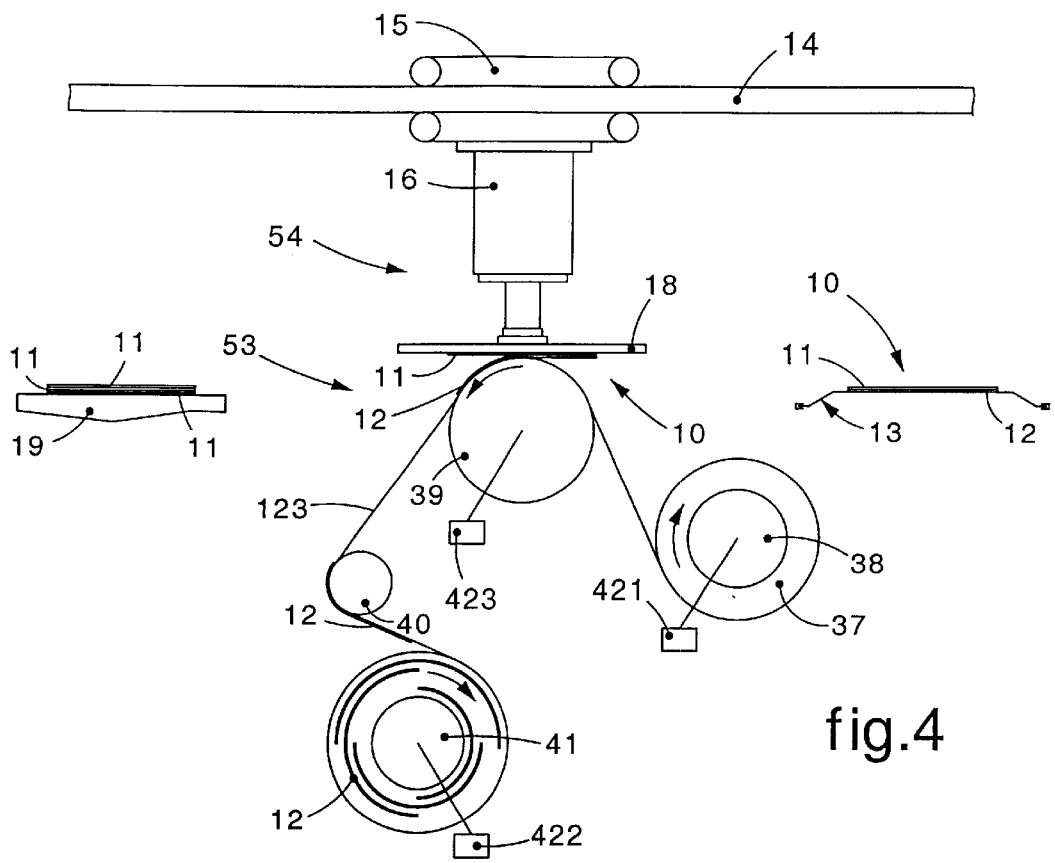
FIG. 4 shows the system to detach the supporting sub-layer, in movement, with a self-adhesive strip.

In FIG. 4 a supporting and unwinding shaft 38 carries a roll 37 of strip 123 of a width sufficient for the purpose. The strip 123 is self-adhesive and partly winds onto the application roller 39 and then turns around the return roller 40, to rewind onto the winding shaft 41.

Figure 5:
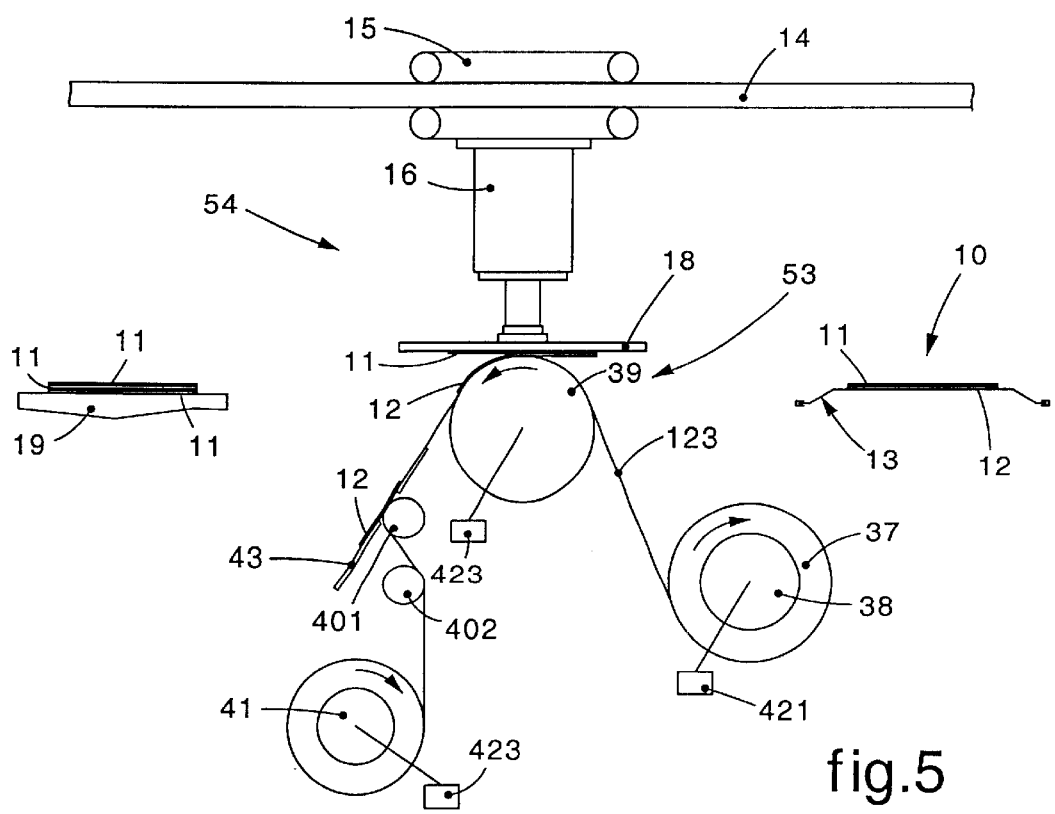
FIG. 5 shows the system to detach the supporting sub-layer, in movement, with a self-adhesive strip and from said self-adhesive strip.
Figure 6:
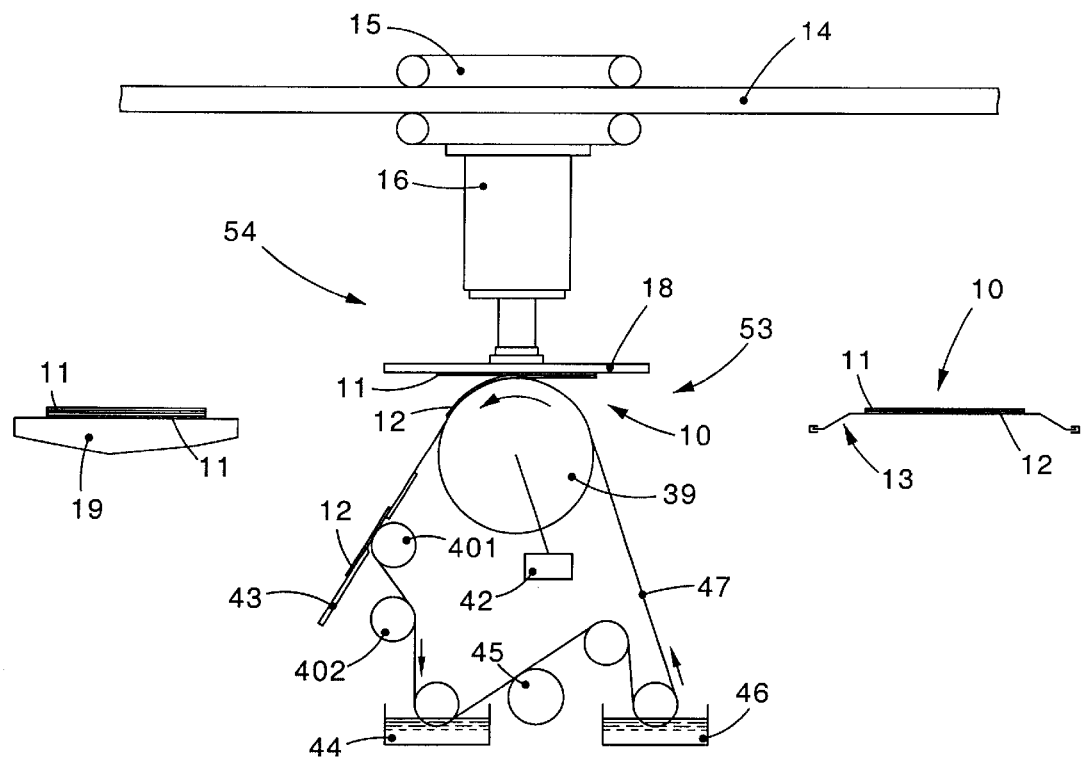
FIG. 6 shows the system to detach the supporting sub-layer, in movement, with a continuous strip.

In the embodiments shown in FIGS. 4, 5 and 6, speed control means 42, 421, 422, 423 are provided which cause the strip 123 and 47, when it comes into cooperation with the plate 18, travels at the same speed of the plate 18.

In FIG. 4 the adhesive strip 123 first attaches itself on the edge of the supporting sub-layer 12 and then on the rest of the supporting sub-layer 12, detaching it from the support 11.

FIG. 4 provides that the strip 123 and the supporting sub-layer 12 are rewound together onto the winding shaft 41.

FIG. 5 provides a first return roller 401 and a second return roller 402, which allow to provide a detachment plate 43 able to detach the supporting sub-layer 12 from the strip 123.

The detachment is facilitated by the reduced width of the strip 123, this being possible when the latter operates with a corner and not with a whole edge or a large part thereof.

In FIG. 6 the strip 47 is a continuous strip with cleaning means 44, for example a tank, to remove the adhesive layer; the cleaning means 44 cooperate with cleaner means 45, for example a brush. Pre-impregnation means 46 also cooperate with the continuous strip 47, and redistribute the adhesive layer over the whole strip 47 or in desired zones thereof.

The means 44, 45 and 46 can operate continuously, or they can be made to intervene on occasions, when the capacity of the adhesive zone of the strip 47 is reduced and near to the threshold of tolerance.

Figure 7:
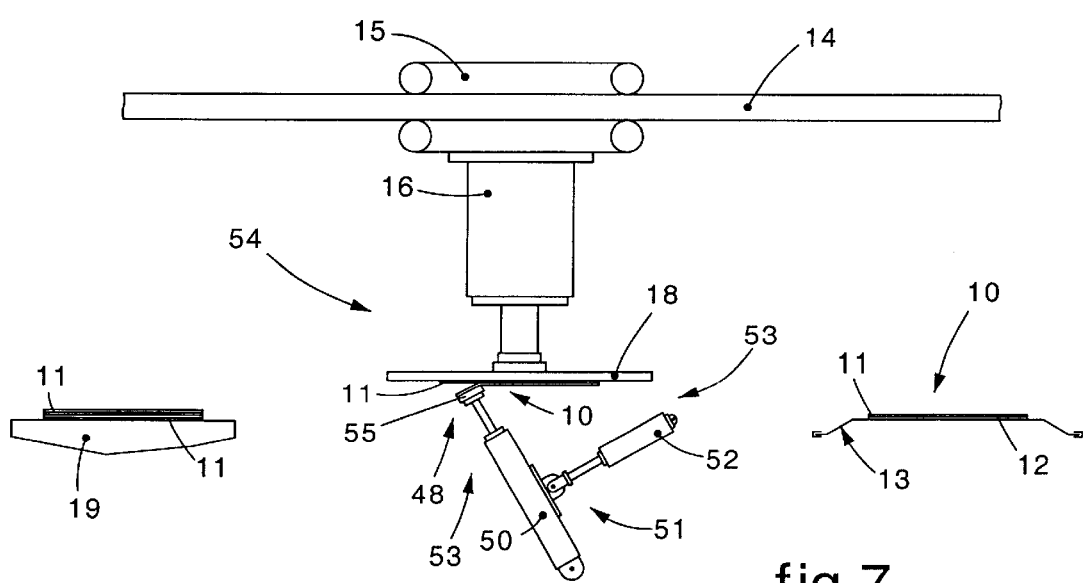
FIG. 7 shows the system to detach the supporting sub-layer, in movement, with a removing element.

In FIG. 7 a removing element 48, with its gripping layer 55, is made to cooperate with the supporting sub-layer 12; by means of the movement control assembly 51, a progressive detachment is achieved.

By way of an example, the movement control assembly 51 provides an attachment jack 50 and a movement jack 52; the movements of these jacks 50 and 52 are directly correlated to the speed of the plate 18.

It is clear that modifications or additions can be made to the invention without departing from the spirit and scope thereof.

For example, a wheel, a movable arm, an elastic element, etc. may be provided instead of the jacks.

It is also clear that, although the invention has been described with reference to specific examples, a skilled person in the art shall certainly be able to achieve many other equivalent forms of automatic separator, all of which shall come within the field and scope of this invention.

What is claimed is:

1. A device to separate a print support, usable in microelectronics or for manufacturing multi-layer electronic circuits, from its associated supporting sub-layer, wherein said print support and the associated supporting sub-layer form a work element and wherein said print support is able to be moved from a first position in which it is stored together with the associated supporting sub-layer to a second position wherein it is positioned without the associated supporting sub-layer for a subsequent manufacturing phase, said device comprising pick up means having depression-type means for selectively picking up said print support in said first position and a plate having at least advancing head means and a tail part in order to maintain motion, wherein moving means is provided for moving said pick up means from said first position to said second position along a defined path, and wherein detachment means is disposed along said defined path, in an intermediate position between said first position and said second position for contacting said supporting sub-layer and causing the removing thereof from said print support during the movement of said pick up means from said first position to said second position.

2. The device of claim 1, wherein said detachment means cooperates with an edge of said supporting sub-layer.

3. The device of claim 1, wherein said detachment means cooperates with a corner of said supporting sub-layer.

4. The device of claim 1, wherein said plate is associated with pressure means able to apply a pre-set pressure between said plate and said detachment means.

5. The device of claim 1, wherein said detachment means comprises a detachment roller.

6. The device of claim 5, wherein said detachment roller comprises at least a detachment hollow cooperating with a corresponding detachment blade.

7. The device of claim 5, wherein said detachment roller cooperates with detachment nozzles able to deliver pressurized fluid.

8. The device of claim 5, wherein said detachment roller has a tangential speed substantially equal to the advancing speed of said pick up means from said first position to said second position.

9. The device of claim 5, wherein said detachment roller is idle and said pick up means cooperates with said idle attachment roller.

10. The device of claim 1, wherein said detachment means comprises an adhesive strip.

11. The device of claim 10, wherein said adhesive strip is continuous.

12. The device of claim 10, wherein said adhesive strip is restorable.

13. The device of claim 10, wherein said adhesive strip is associated with a delivery roll and a winding roll.

14. The device of claim 10, wherein a stationary element cooperates with said adhesive strip to detach said supporting sub-layer from said adhesive strip.

15. The device of claim 1, wherein said detachment means comprises a removing element associated with a movement control assembly.

16. A device to separate a print support, usable in microelectronics or for manufacturing multi-layer electronic circuits, from its associated supporting sub-layer, wherein said print support and the associated supporting sub-layer form a work element and wherein said print support is able to be moved from a first position in which it is stored together with the associated supporting sub-layer to a second position wherein it is positioned without the associated supporting sub-layer for a subsequent manufacturing phase, said device comprising pick up means having depression-type means for selectively picking up said print support in said first position, wherein moving means is provided for moving said pick up means from said first position to said second position along a defined path, and wherein detachment means in the form of an adhesive member is disposed along said defined path, in an intermediate position between said first position and said second position for contacting said supporting sub-layer and causing the removing thereof from said print support during the movement of said pick up means from said first position to said second position, and wherein a stationary element cooperates with said adhesive member to detach said supporting sub-layer from said adhesive member.

17. The device of claim 16, wherein said detachment means cooperates with an edge of said supporting sub-layer.

18. The device of claim 16, wherein said detachment means cooperates with a corner of said supporting sub-layer.

19. The device of claim 16, wherein said pick up means comprises a plate associated with pressure means able to apply a pre-set pressure between said plate and said detachment means.

20. The device of claim 16, wherein said detachment means comprises a detachment roller.

21. The device of claim 20, wherein said detachment roller comprises at least a detachment hollow cooperating with a corresponding detachment blade.

22. The device of claim 20, wherein said detachment roller cooperates with detachment nozzles able to deliver pressurized fluid.

23. The device of claim 20, wherein said detachment roller has a tangential speed substantially equal to the advancing speed of said pick up means from said first position to said second position.

24. The device of claim 20, wherein said detachment roller is idle and said pick up means comprises a plate having at least advancing head means and cooperates with said idle attachment roller.

25. The device of claim 24, wherein said plate has a tail part in order to maintain motion.

26. The device of claim 16, wherein said adhesive member is continuous.

27. The device of claim 16, wherein said adhesive member is restorable.

28. The device of claim 16, wherein said adhesive member is associated with a delivery roll and a winding roll.

* * * * *